United States Patent
Hwang et al.

(10) Patent No.: US 7,102,141 B2
(45) Date of Patent: Sep. 5, 2006

(54) FLASH LAMP ANNEALING APPARATUS TO GENERATE ELECTROMAGNETIC RADIATION HAVING SELECTIVE WAVELENGTHS

(75) Inventors: Jack Hwang, Portland, OR (US); Stephen M. Cea, Hillsboro, OR (US); Paul Davids, Portland, OR (US); Karson L. Knutson, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 46 days.

(21) Appl. No.: 10/952,969

(22) Filed: Sep. 28, 2004

(65) Prior Publication Data

US 2006/0065849 A1    Mar. 30, 2006

(51) Int. Cl.
*G21K 5/02* (2006.01)

(52) U.S. Cl. .............................. 250/455.11; 250/492.2; 219/390; 219/405; 219/411; 438/455; 438/407; 438/795; 438/771

(58) Field of Classification Search ................. None
See application file for complete search history.

(56) References Cited

U.S. PATENT DOCUMENTS

| | | | |
|---|---|---|---|
| 6,376,806 B1 | 4/2002 | Yoo | |
| 6,911,376 B1* | 6/2005 | Yoo | 438/455 |
| 6,965,092 B1* | 11/2005 | Mahawili | 219/390 |
| 2004/0185680 A1* | 9/2004 | Hauf et al | 438/795 |

FOREIGN PATENT DOCUMENTS

| | | |
|---|---|---|
| EP | 0 574 158 A1 | 12/1993 |
| EP | 0 629 591 A1 | 12/1994 |
| WO | WO 91/10873 | 7/1991 |

OTHER PUBLICATIONS

"High Performance Flash and Arc Lamps," PerkinElmer™ optoelectronics, 40 pgs., http://optoelectronics.perkinelmer.com/content/RelatedLinks/flashcatalog.pdf, Jan. 1, 2004.

* cited by examiner

*Primary Examiner*—Jack Berman
*Assistant Examiner*—Zia R. Hashmi
(74) *Attorney, Agent, or Firm*—Schwabe, Williamson & Wyatt, P.C.

(57) ABSTRACT

Flash lamp apparatuses that generate electromagnetic radiation with wavelengths greater than and/or less than a defined range of wavelengths are disclosed.

26 Claims, 4 Drawing Sheets

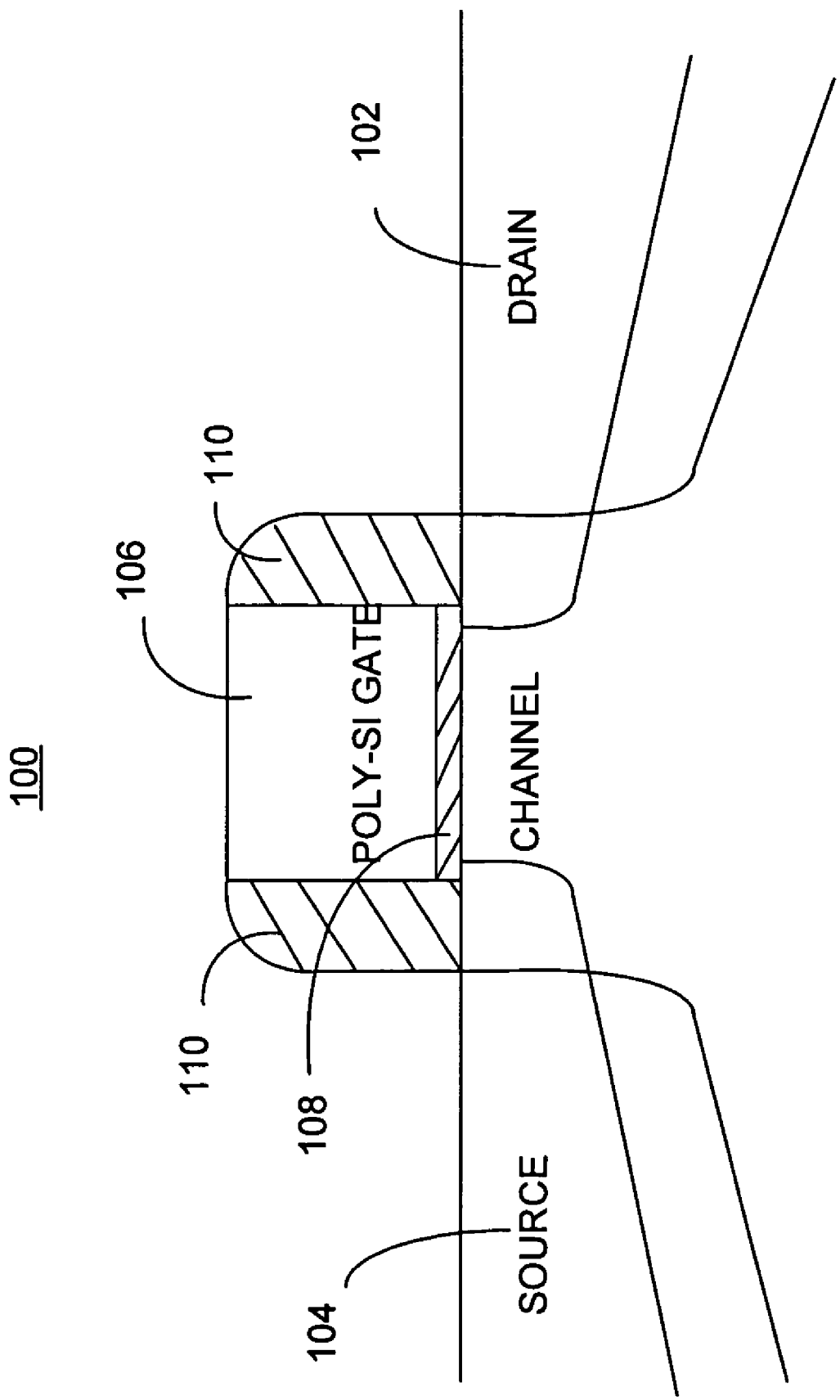

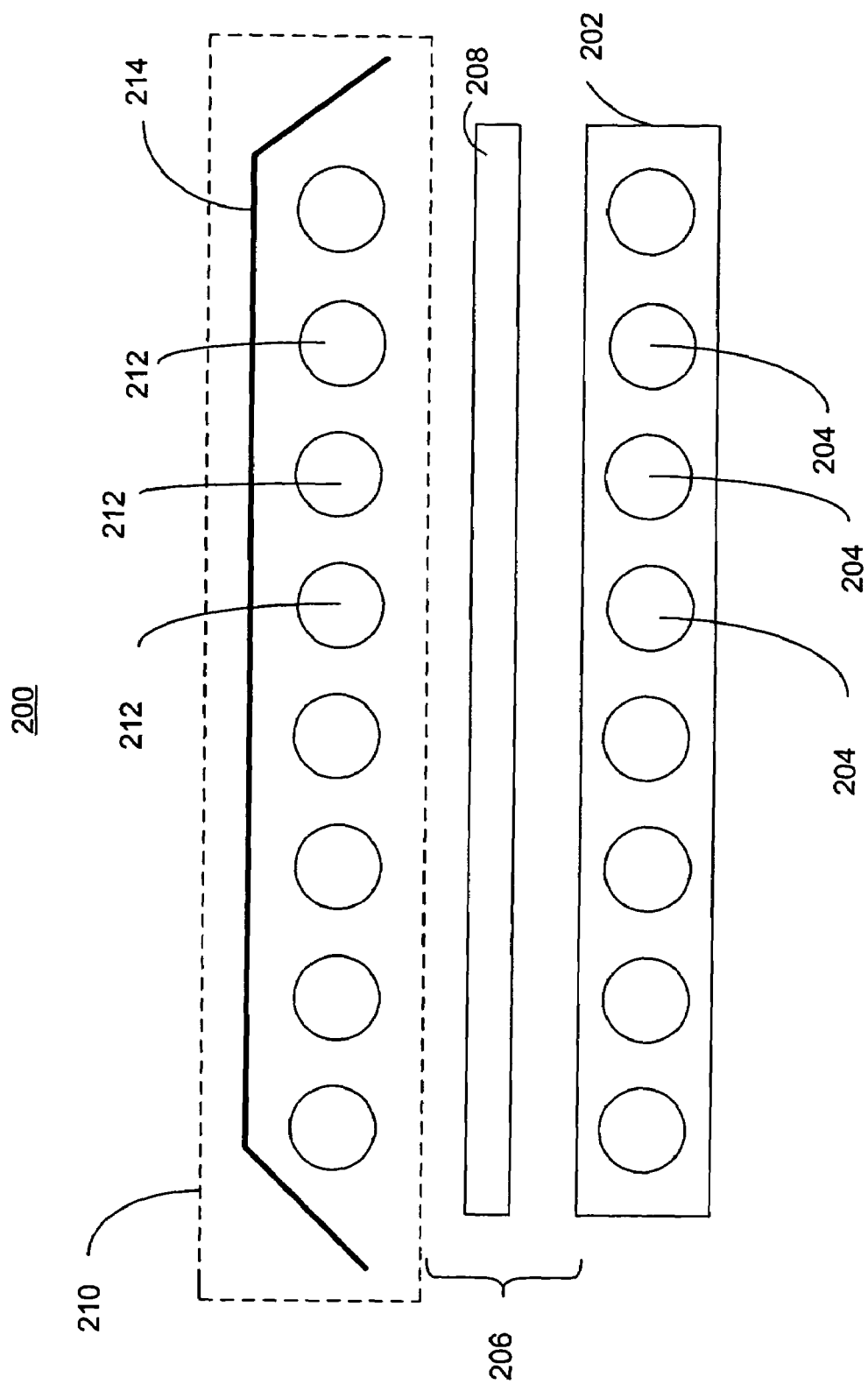

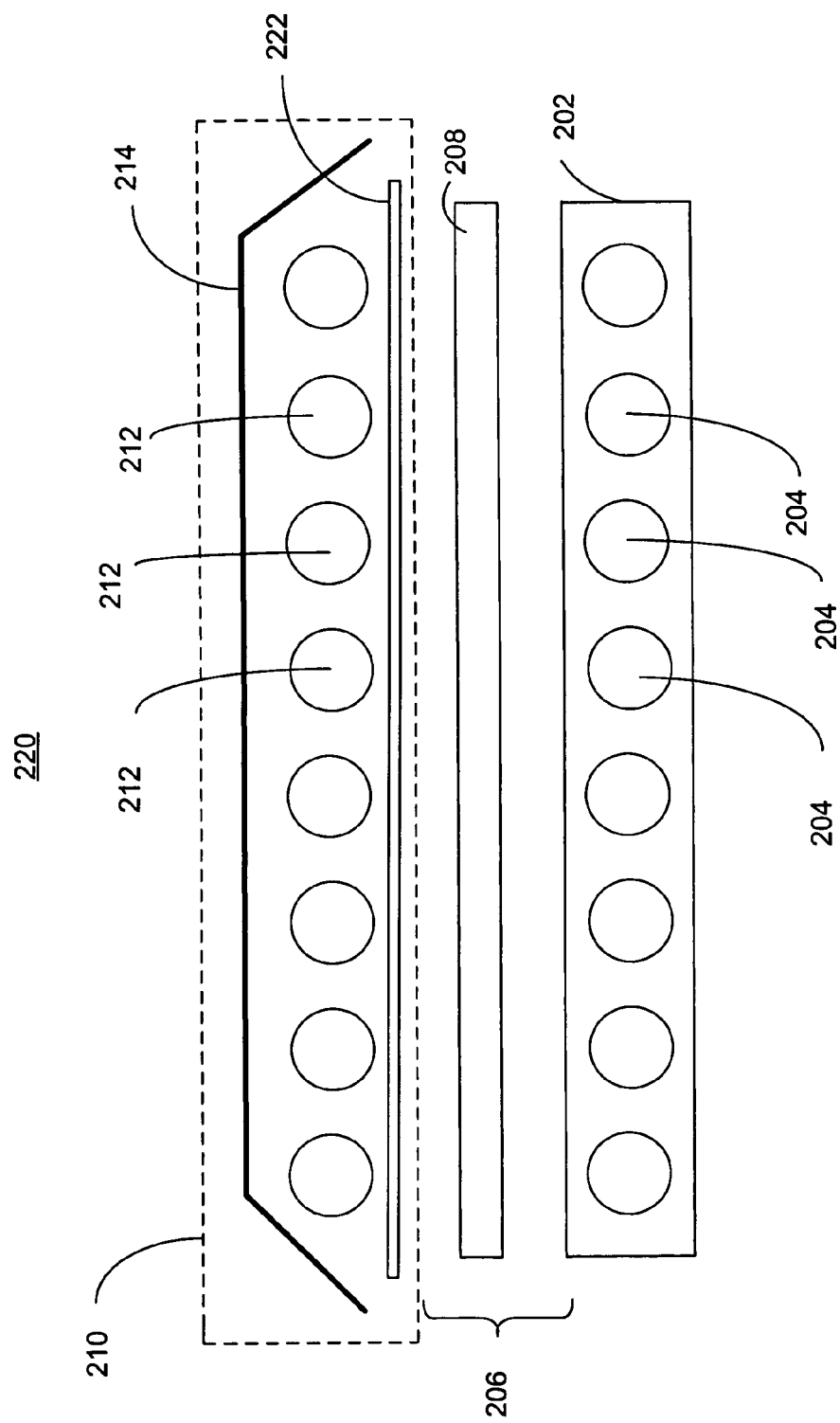

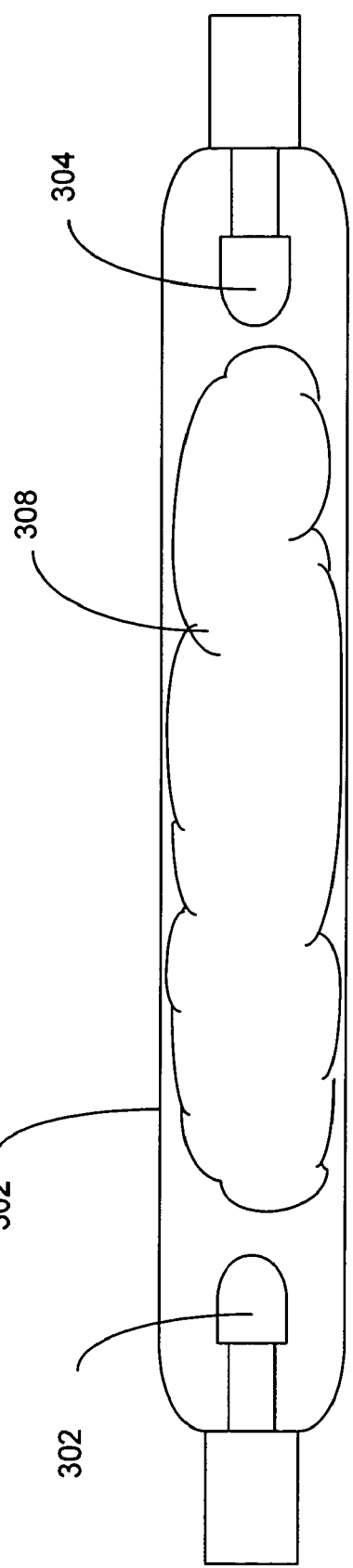

FLASH LAMP ANNEALING APPARATUS TO GENERATE ELECTROMAGNETIC RADIATION HAVING SELECTIVE WAVELENGTHS

BACKGROUND OF THE INVENTION

1. Field of the Invention

Embodiments of the present invention relate to, but are not limited to, electronic devices, and in particular, to the field of electronic device manufacturing.

2. Description of Related Art

In the current state of electronic device manufacturing, a process called flash lamp annealing (FLA) is sometimes used during the manufacture of semiconductor devices and during the development of semiconductor manufacturing processes. FLA may be employed to achieve several goals including, for example, activating ion-implanted dopants in doped regions of an electronic device such as a transistor. Other reasons for FLA may include, for example, recrystallization, reflow operations, spin on glass (SOG) annealing, silicidation, low-k/high-k dielectric annealing, and defect annealing.

In flash lamp annealing, a substrate, such as a wafer or die substrate, is typically exposed to intense electromagnetic radiation that is comprised of radiation having wavelengths across some portion of the electromagnetic spectrum. For example, in one FLA process, the electromagnetic radiation used to expose the substrate may include radiation having wavelengths corresponding to the ultraviolet region of the electromagnetic spectrum (i.e., 10 to 400 nanometers (nm)). Such electromagnetic radiation may further include the visible light spectrum (i.e., 400 to 750 nm) and even into the infrared spectrum (i.e., 750 nm to 100 microns). For purposes of this description, such electromagnetic radiation will be called "broad-spectrum" radiation.

The substrate being exposed during a flash lamp annealing process is typically exposed to the electromagnetic radiation for a time duration in the range of microseconds to hundreds of milliseconds. For example, one application of in flash lamp annealing could be to anneal a silicon substrate wherein the substrate could be exposed to intense electromagnetic radiation for less than 10 milliseconds at a power level of at least 0.015 J/cm2.

BRIEF DESCRIPTION OF DRAWINGS

The present invention will be described by way of exemplary embodiments, but not limitations, illustrated in the accompanying drawings in which like references denote similar elements, and in which:

FIG. 1 illustrates an exemplary CMOS transistor;

FIG. 2A illustrates a system that includes a selective light generator for generating electromagnetic radiation with selective wavelengths in accordance with some embodiments of the invention;

FIG. 2B illustrates a system that includes a selective light generator for generating electromagnetic radiation with selective wavelengths in accordance with some embodiments of the invention; and FIG. 3 illustrates a light source that generates electromagnetic radiation with selective wavelengths in accordance with some embodiments.

DETAILED DESCRIPTION OF ILLUSTRATIVE EMBODIMENTS

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention. In other instances, well-known electrical structures and circuits are shown in block diagram form in order not to obscure the disclosed embodiments of the present invention.

According to various embodiments of the invention, methods and apparatuses for exposing a substrate to electromagnetic radiation of selective wavelengths are provided. For the embodiments, a flash lamp annealing (FLA) process may be performed using an apparatus that is comprised of, among other things, a selective light generator that generates electromagnetic radiation having selective wavelengths to radiate the substrate. In various embodiments, the substrate being exposed/radiated may be comprised of a plurality of components that have different electromagnetic radiation absorption properties. By exposing this substrate to electromagnetic radiation having selective wavelengths, the heating of each component can be individually optimized. In some cases, the optimum corresponds to uniform heating across each component. In other cases, a select component or components may be selectively heated to an elevated temperature relative to the other components.

In various embodiments, the substrate being exposed/radiated may be a wafer or die substrate that may include one or more first substrate components that tend to absorb electromagnetic radiation of a specific wavelength or a range of wavelengths at a higher rate than other substrate components. In other embodiments, the first substrate components may tend to reflect electromagnetic radiation of a specific wavelength or a range of wavelengths at a higher rate than other substrate components. In some embodiments, the first substrate components may be a nitride film that may have relative high absorption coefficient values particularly as they relate to electromagnetic radiation of specific wavelengths. For these embodiments, the substrate may include static random access memory (SRAM) and logic circuitry portions, each of the portions having different concentrations or densities of nitride spacers.

In order to assure optimum heating of the substrate, the substrate may be exposed to electromagnetic radiation that is comprised of electromagnetic radiation having selective wavelengths. In some embodiments, the selective wavelengths may be greater than and/or less than a defined range of wavelengths, the defined range of wavelengths being the wavelengths corresponding to the wavelengths of electromagnetic radiation that tend to be absorbed or reflected by the first substrate components at a higher rate than other substrate components.

According to various embodiments, a selective light generator is provided that may be used to flash anneal or flash expose the substrate with electromagnetic radiation having selective wavelengths. For these embodiments, the selective light generator may generate electromagnetic radiation that includes electromagnetic radiation having wavelengths greater than or less than the defined range of wavelengths described above.

In various embodiments, the selective light generator may include one or more light sources and one or more filters placed between the one or more light sources and the substrate to be exposed. In some embodiments, the one or more light sources may be one or more flash lamps and the filter may be incorporated into the flash lamp bulb itself or a jacket or sheath that envelope the one or more flash lamps. For these embodiments, the flash lamps may be plasma lamps and the filtering jackets may be cerium oxide doped jackets. The flash lamps may generate broad-spectrum radiation and the jackets of the flash lamps may be employed to filter out electromagnetic radiation having undesirable wavelengths (e.g., the wavelengths corresponding to the wavelengths of electromagnetic radiation that tend to be absorbed or reflected by the first substrate components at a higher rate than other substrate components).

In other embodiments, the selective light generator may include a filter that is completely external to the one or more light sources. For these embodiments, the one or more light sources may be flash lamps having jackets that are substantially transparent and that does not filter out electromagnetic radiation. The one or more light sources may generate, for example, broad-spectrum radiation and an external filter may filter out electromagnetic radiation having a defined range of wavelengths from the broad-spectrum radiation that is generated by the one or more light sources.

In alternative embodiments, the selective light generator may include one or more light sources that generate electromagnetic radiation of selective wavelengths without the use of filters. For these embodiments, the one or more light sources may generate electromagnetic radiation of specific wavelengths and may not rely on filtering techniques in order to generate electromagnetic radiation of selective wavelengths. Examples of such light sources include a single or multiple lasers chosen to operate at specific wavelength(s) that is greater than or less than the a range of wavelengths that is absorbed or reflected more efficiently by the first substrate components. These wavelengths may be chosen to achieve the optimum desirable temperature distribution on the wafer which may or may not be uniform.

According to various embodiments, the selective light generator may be part of a flash lamp annealing system that exposes a substrate, such as a wafer substrate, to electromagnetic radiation having selective wavelengths. For these embodiments, the system may be a system for manufacturing electronic devices and may include a chamber to receive the substrate being exposed. The system may further include a heating element to preheat the substrate being exposed.

In various embodiments, the novel methods and apparatuses described above may be employed during a flash lamp annealing process of a substrate such as a wafer or die substrate in order to, for example, modulate or invert the magnitude of hotspots from forming on the substrate. The temperature distribution may be determined by the optimum yield/performance tradeoff for that local region. Hotspots on the substrate may develop during the flash annealing process because some portions of the substrate may absorb electromagnetic radiation at a higher rate or more efficiently than other portions. This may be due to the fact that some portions of the substrate may contain substrate components or a higher density of substrate components having relative high absorption coefficient values or relative high reflectance values, at least as they relate to electromagnetic radiation of specific wavelengths.

For example, in some embodiments, the substrate being flash annealed may be a die or wafer substrate that includes numerous electronic devices such as transistors, capacitors, resistors and the like. These devices may be further made of various components or materials that may have unique electromagnetic radiation absorption characteristics. For example, some of these components may have relatively high absorption coefficient values which means that these components may tend to absorb electromagnetic radiation with specific wavelengths more efficiently or at a higher rate than other substrate components. Thus, portions of a die or wafer having a greater concentration of these components may tend to heat up faster than other portions when exposed to, for example, broad-spectrum radiation during a flash lamp annealing process. As a result, the high absorption rate of these components and the uneven distribution of these components in the substrate being flashed annealed may result in "hotspots" forming during, for example, a flash annealing process. On the other hand, other components may have relatively high reflectance which means they tend to reflect electromagnetic radiation with specific wavelengths more efficiently or at a higher rate than other substrate components. Thus, portions of a die or wafer having a greater concentration of these components may tend to heat up slower than other portions when exposed to, for example, broad-spectrum radiation during a flash lamp annealing process. As a result, the high reflectance of these components and the uneven distribution of these components in the substrate being flashed annealed may result in "coldspots" forming during, for example, a flash annealing process For instance, in some embodiments, the substrate may be a wafer used to form system on chip (SOC) dice. For these embodiments, each of the SOC dice that may be eventually formed from the wafer may be divided into distinct sections or regions dedicated to different functions. For example, one portion of a SOC die may be dedicated to static random memory (SRAM) while another portion may be dedicated to logic circuitry. When such a die is divided in such a manner, the portion dedicated to SRAM may be more densely populated with complementary semiconductor metal oxide (CMOS) transistors than the logic circuitry portion. When there are different types of circuits on a single chip, a uniform temperature is not necessarily the optimum temperature profile. Each separate circuit element has a yield/performance tradeoff that can be optimized. This optimum is not the same for all circuits. This is why the wavelength/reflectivity engineering represents a new variable that can be used to optimize total chip performance.

FIG. 1 depicts an exemplary complementary metal oxide semiconductor (CMOS) transistor device that may populate a substrate, such as the wafer or die substrate described above, in accordance with some embodiments. For the embodiments, the transistor 100 includes a drain 102, a source 104 and a poly-silicon gate 106. The transistor 100 may further include a thin oxide layer 108 that is adjacent to the gate 106. In order to form the different doping regions associated with the drain 102 and source 104 during the manufacturing process of the transistor 100, nitride spacers 110 have been formed adjacent to the gate 106. These nitride spacers 110 may be made of nitride materials such as silicon nitride.

The nitride materials that comprise the spacers 110, may have relatively high absorption coefficient values and may tend to absorb electromagnetic radiation having a defined range of wavelengths at a higher rate than other substrate components or materials. For example, a nitride spacer that is comprised of silicon nitride may tend to absorb electromagnetic radiation in the ultraviolet region (i.e., 10 nm to 400 nm) of the light spectrum. In particular, these nitride spacers may have a particular affinity for electromagnetic radiation having wavelengths between about 200 nm to about 350 nm.

According to various embodiments, a selective light generator that generates electromagnetic radiation of selective wavelengths is provided. For the embodiments, the selective light generator may be used in a flash lamp annealing process of a substrate and may generate electromagnetic radiation having wavelengths that is greater than and/or less than a defined range of wavelengths. In various embodiments, the defined range of wavelengths may correspond to the wavelengths of electromagnetic radiation that tend to be absorbed at a higher rate by a first substrate component (e.g., nitride spacers) than by other substrate components.

FIG. 2A depicts a system that may be used for a flash lamp annealing process in accordance with some embodiments. For the embodiments, the system 200 includes a pre-flash heating element 202 that includes multiple heating lamps 204. In other embodiments, however, the pre-flash heating element 202 may be comprised of a hot plate or other types of heating devices other than heating lamps 204. Above the heating element 202 is a substrate holding chamber 206 that may be used to hold a substrate 208 during, for example, a flash annealing process. For Example, the substrate 208 may be a semiconductor die or wafer substrate. Above the substrate 208 is a selective light generator 210. For these embodiments, the selective light generator 210 may be comprised of a plurality of light sources 212 and a reflector 214.

In various embodiments, the light sources 212 may generate electromagnetic radiation having selective wavelengths. For these embodiments, the generated electromagnetic radiation may include electromagnetic radiation with selective wavelengths that may be greater than and/or less than a defined range of wavelengths, the defined range of wavelengths corresponding to the wavelengths of electromagnetic radiation that tend to be absorbed or reflected at a higher rate by a first substrate component than by other substrate components. The light sources 212 may be flash lamps with light filtering jackets (to be discussed in greater detail below), lasers and/or solid state devices such as light emitting diodes (LEDs).

The heating lamps 204 may be tungsten halogen lamps. For the embodiments, the heating element 202 may be used to elevate the temperature of the substrate 208 to a predefined temperature prior to flash annealing the substrate 208.

The substrate 208 may be a die or wafer substrate that includes a plurality of substrate components that have different absorption coefficients. In various embodiments, the substrate 208 may be comprised of at least first substrate components that absorb or reflect, at a higher rate than other substrate components, electromagnetic radiation having a defined range of wavelengths. In some embodiments, the first substrate components may be nitride spacers that are comprised of materials that absorb, at a relatively high rate, electromagnetic radiation having wavelengths between about 200 nm to about 350 nm.

In various embodiments, the system 200 may be used for a flash lamp annealing process. For these embodiments, the substrate 208 to be flashed annealed may be initially preheated using, for example, the heating element 202 as described above. Once the substrate 208 has reached a predefined temperature, the selective light generator 210 may generate electromagnetic radiation of selective wavelengths. In various embodiments, the selective wavelengths may include wavelengths greater than and/or less than a defined range of wavelengths. The substrate 208 may be exposed to the electromagnetic radiation of selective wavelengths for a period of about 10 milliseconds to about 10 microseconds. As a result of the exposure, in various embodiments, the temperature of the substrate 208 may be raised. In one example a silicon substrate could be heated to any temperature between its starting temperature and the melting point of silicon at about 1410 C.

FIG. 2B depicts another system that may be used for a flash lamp annealing process in accordance with some embodiments. For these embodiments, the system 220 is similar to the system 200 of FIG. 2A. However, unlike the previous system 200, the light sources 212 in this system 220 do not generate electromagnetic radiation having selective wavelengths but instead, may generate, for example, broad-spectrum radiation. In some embodiments, the broad-spectrum radiation includes electromagnetic radiation having wavelengths between about 200 to about 800 nanometers (nm). Further, unlike the system 200 of FIG. 2A, the selective light generator 210, in this case, may further include an optical filter 222 that is deposed between the light sources 212 and the substrate 208 being flashed annealed. For these embodiments, the optical filter 222 may be used to filter out undesirable electromagnetic radiation (e.g., the electromagnetic radiation with the defined range of wavelengths being absorbed by, for example, the nitride spacers) from the broad-spectrum radiation generated by the light sources 212.

FIG. 3 depicts one of the light sources of FIG. 2A, in further detail, in accordance with some embodiments. For the embodiments, the light source 300 is a flash lamp such as a plasma lamp with a light filtering jacket. The light source 300 includes a jacket 302 that envelops a cathode 304, an anode 306 and gas 308. The jacket 302 may be comprised of a quartz or fused silica material and may contain the gas 308 within a completely sealed space. The gas 308, in various embodiments, may be any gas used to generate plasma.

For the embodiments, the light source 300 may generate electromagnetic radiation having selective wavelengths. The jacket 302 may function as an optical filter to filter out electromagnetic radiation having a defined range of wavelengths. For example, when the gas 308 is xenon, the electromagnetic radiation emitted by the gas 308, which changes into plasma when energized, may be comprised of radiation with wavelengths between about 200 to about 800 nm. The jacket 302, in these embodiments, may act as an optical filter to filter out electromagnetic radiation having wavelengths between about 200 to about 350 nm.

In order to achieve such filtering, in some embodiments, the jacket 302 may be comprised of a doped quartz material. For these embodiments, the doped quartz material may be cerium oxide doped clear fused quartz material. In other embodiments, however, the filtering may be performed using a jacket that may be made of borosilicate glass (Pyrex®).

In other embodiments, the light sources 212 (and/or the selective light generator 210) may generate electromagnetic radiation of selective wavelengths without the use of filtering components. For these embodiments, the light sources 212 may be a laser or group of lasers that generate electromagnetic radiation of a specific wavelength or range of wavelengths.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the embodiments of the present invention. Therefore, it is manifestly intended that embodiments of this invention be limited only by the claims.

What is claimed is:

1. A system, comprising:
    a chamber to receive a substrate; and
    a selective light generator including one or more light sources to generate electromagnetic radiation to radiate the substrate, the electromagnetic radiation having wavelengths greater than or less than a defined range of wavelengths, excluding electromagnetic radiation having wavelengths within the defined range, the excluded electromagnetic radiation being more efficiently adsorbed or reflected by a portion of the substrate than other portion(s) of the substrate.

2. The system of claim 1, wherein the one or more light sources are adapted to generate broad-spectrum radiation including electromagnetic radiation having wavelengths within the defined range of wavelengths.

3. The system of claim 2, wherein the selective light generator further comprises a filter disposed in between the one or more light sources and the substrate to be radiated, to filter out electromagnetic radiation having wavelengths within the defined range of wavelengths from the broad-spectrum radiation.

4. The system of claim 1, wherein the one or more light sources comprises a plasma lamp.

5. The system of claim 4, wherein the plasma lamp comprises a jacket, adapted to operate as a filter to filter out electromagnetic radiation having wavelengths within the defined range of wavelengths.

6. The system of claim 5, wherein the jacket comprises cerium oxide doped quartz.

7. The system of claim 1, wherein the defined range of wavelengths is from about 200 to 350 nanometers.

8. The system of claim 1, wherein said chamber is adapted to receive a wafer substrate.

9. The system of claim 1, wherein said chamber is adapted to receive a substrate having semiconductor devices that incorporate a plurality of components.

10. The system of claim 1, wherein said chamber is adapted to receive a substrate having a first substrate component that absorbs or reflects, at a higher rate than other substrate components, electromagnetic radiation with wavelengths within the defined range of wavelengths.

11. The system of claim 10, wherein the first substrate component comprises a nitride spacer.

12. A light bulb, comprising:
a gas to form electromagnetic radiation generating plasma when energized; and
a jacket that envelops the gas, adapted to filter out electromagnetic radiation having wavelengths within a defined range of wavelengths that is more efficiently absorbed or reflected by a portion of a substrate radiated by the light bulb than another portion of the substrate.

13. The light bulb of claim 12, wherein the jacket comprising cerium oxide doped quartz.

14. The light bulb of claim 12, wherein the defined range of wavelengths is from about 200 to 350 nanometers.

15. The light bulb of claim 12, wherein the substrate component is a substrate component selected from a group consisting of a nitride spacer and a substrate having regions with varying densities of the substrate component.

16. A selective light generator, comprising:
a light source to generate electromagnetic radiation; and
a filter to filter out electromagnetic radiation having wavelengths within a defined range of wavelengths from the electromagnetic radiation generated by the light source to produce filtered radiation, the filtered electromagnetic radiation having wavelengths within the defined range being electromagnetic radiation having wavelengths that are more efficiently absorbed or reflected by a portion of a substrate to be radiated by the selective light generator than another portion of the substrate.

17. The selective light generator of claim 16, wherein the filter filters out electromagnetic radiation having wavelengths between about 200 nm to about 350 nanometers.

18. The selective light generator of claim 16, wherein the light source generates electromagnetic radiation comprising the defined range of wavelengths.

19. The selective light generator of claim 16, wherein the light source comprises a plasma lamp.

20. A method, comprising:
providing a substrate; and
exposing the substrate to electromagnetic radiation with wavelengths greater than or less than a defined range of wavelengths, excluding electromagnetic radiation with wavlentghs within the defined range, the excluded electromagnetic radiation being electromagentic radiation more efficiently absorbed or reflected by a portion of the substrate than other portion(s) of the substrate.

21. The method of claim 20, wherein the method further comprises energizing a gas to form electromagnetic radiation generating plasma.

22. The method of claim 20, wherein said providing comprises providing a substrate having a nitride spacer.

23. The method of claim 20, wherein said providing comprises providing a substrate having semiconductor devices or varying densities.

24. The method of claim 20, wherein the defined range of wavelengths is from about 200 to about 350 nanometers (nm).

25. The method of claim 20, wherein said exposing comprises generating broad-spectrum radiation, the broad-spectrum radiation comprising at least electromagnetic radiation with wavelengths within the defined range of wavelengths, filtering out electromagnetic radiation with wavelengths within the defined range of wavelengths from the broad-spectrum radiation to produce filtered radiation, and exposing the substrate to the filtered radiation.

26. The method of claim 25, wherein the broad-spectrum radiation comprises electromagnetic radiation having wavelengths from about 200 to about 800 nanometers.

* * * * *

UNITED STATES PATENT AND TRADEMARK OFFICE
CERTIFICATE OF CORRECTION

PATENT NO. : 7,102,141 B2
APPLICATION NO. : 10/952969
DATED : September 5, 2006
INVENTOR(S) : Hwang et al.

It is certified that error appears in the above-identified patent and that said Letters Patent is hereby corrected as shown below:

Title Page; sheet 4 of 4;
Figure 3

[Ref no.] The left most 302 should be 306.

Signed and Sealed this

Twenty-seventh Day of November, 2007

JON W. DUDAS
*Director of the United States Patent and Trademark Office*